United States Patent [19]

Iacoponi

[11] Patent Number: 5,912,508
[45] Date of Patent: *Jun. 15, 1999

[54] METAL-SEMICONDUCTOR CONTACT FORMED USING NITROGEN PLASMA

[75] Inventor: John A. Iacoponi, San Jose, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/715,140

[22] Filed: Sep. 18, 1996

Related U.S. Application Data

[63] Continuation of application No. 08/434,359, May 5, 1995, abandoned, and a continuation of application No. 08/393,635, Feb. 24, 1995, Pat. No. 5,545,592.

[51] Int. Cl.⁶ .............................. H01L 23/48; H01L 23/52
[52] U.S. Cl. ..................... 257/770; 257/768; 257/763; 257/764
[58] Field of Search .................... 257/734, 736, 257/741, 750, 763, 764, 768, 770, 757, 765, 751

[56] References Cited

U.S. PATENT DOCUMENTS

| | | | |
|---|---|---|---|
| 4,851,369 | 7/1989 | Ellwanger et al. | 437/200 |
| 4,994,410 | 2/1991 | Sun et al. | 257/757 |
| 5,049,975 | 9/1991 | Ajika et al. | 257/770 |
| 5,242,860 | 9/1993 | Nulman et al. | 437/190 |
| 5,317,187 | 5/1994 | Hindman et al. | 257/659 |
| 5,585,673 | 12/1996 | Joshi et al. | 257/765 |

FOREIGN PATENT DOCUMENTS

| | | |
|---|---|---|
| 63-12132 | of 1988 | Japan . |
| 01-25572 | of 1989 | Japan . |
| 2-231713 | of 1990 | Japan . |
| 4-137621 | of 1992 | Japan . |

*Primary Examiner*—Carl Whitehead, Jr.
*Attorney, Agent, or Firm*—Skjerven, Morrill, MacPherson, Franklin & Friel, L.L.P.; Edward C. Kwok; Philip W. Woo

[57] ABSTRACT

A low-resistance metal-semiconductor contact for use in integrated circuits includes a titanium silicide layer overlaying a semiconductor body. The top surface of the titanium silicide layer is a combination of silicides and titanium nitride formed by exposing the top surface to a nitrogen plasma. This combination surface is covered by a layer of titanium nitride, which is in turn covered by a layer of conductive metal, such as tungsten.

8 Claims, 4 Drawing Sheets

METAL-SEMICONDUCTOR CONTACT FORMED USING NITROGEN PLASMA

CROSS-REFERENCE

This application is a continuation of application Ser. No. 08/434,359, filed May 5. 1995, now abandoned, and a continuation of Ser. No 08/393,635 filed Feb. 24, 1995, now U.S. Pat. No. 5,545,592.

The present application is related to application Ser. No. 08/341,781, filed Nov. 30, 1994, entitled "A Process for In-Situ Deposition of a Ti/TiN Barrier Metal Stack," by inventors P. Besser, K. Tran, R. Alvis, and J. Iacoponi, now abandoned, which is incorporated herein by reference.

BACKGROUND

Many current integrated circuit technologies, especially those employing sub-half-micron minimum feature sizes, use titanium silicide ($TiSi_x$, where x is typically 2) contacts to silicon in order to assure low contact resistance.

FIGS. 1 through 7 describe conventional steps used to create metal-to-silicon contacts. Beginning with FIG. 1, an oxide layer 110 is conventionally grown on the surface of a silicon body 100 by subjecting exposed portions of silicon body 100 to an oxidizing environment. Referring next to FIG. 2, a titanium silicide layer 120 is typically formed by opening a window in the oxide layer 110 to expose an area of silicon body 100 and depositing a titanium layer 115 over the exposed surfaces of silicon body 100 and oxide layer 110.

Silicon body 100, oxide layer 110, and titanium layer 115 are annealed at high temperature, typically with rapid thermal anneal (RTA) in the range of 600° C. to 900° C. Titanium layer 115 does not react with oxide layer 110, but reacts with the exposed surface of silicon body 100 to form titanium silicide layer 120, as shown in FIG. 3. The unreacted portions of titanium layer 115 are then removed, typically using a wet chemical etch.

FIG. 4 shows a conventional titanium silicide contact. To form this contact from the structure of FIG. 3, a dielectric layer 130, which in one embodiment is silicon dioxide, is deposited over the surfaces of oxide layer 110 and titanium silicide layer 120. A contact hole 140 is then etched in dielectric layer 130 to uncover titanium silicide layer 120. Any of a number of conventional wet and dry etching techniques may be used to create contact hole 140. However, wet etching techniques are not effective for feature sizes of less than approximately 3 $\mu$m.

As shown in FIG. 5, to the structure of FIG. 4 is added a titanium layer 150 using conventional titanium deposition processes, such as physical or chemical vapor deposition. Native non-conductive metal oxides that may have formed on the surface of titanium silicide layer 120 are consumed by the titanium (i.e., some portion of the titanium oxidizes, and the titanium oxide disburses throughout titanium layer 150). The consumption of native oxide results in a good metallurgical connection between titanium layer 150 and titanium silicide layer 120. Titanium layer 150 therefore provides low electrical contact resistance to underlying titanium silicide layer 120. Referring to FIG. 6, a titanium nitride layer 160 is deposited over titanium layer 150 using conventional titanium nitride deposition techniques, such as physical or chemical vapor deposition. The deposition of titanium nitride layer 160 is followed by a conventional annealing process, such as rapid thermal annealing (RTA), typically at temperatures ranging from 500° C. to 700° C. Titanium nitride layer 160 provides a protective barrier for titanium layer 150 during the chemical vapor deposition of tungsten contacts and acts as an adhesion promoter for tungsten contact formation.

FIG. 7 shows a conventional metal-to-silicon contact formed after a tungsten layer 170 has been deposited, using conventional deposition techniques, over the surface of titanium nitride layer 160.

There are numerous problems associated with the conventional process of FIGS. 1 through 7. For example, in the tungsten deposition step of FIG. 7, tungsten hexafluoride gas ($WF_6$) is introduced onto the surface of titanium nitride layer 160. Unfortunately, tungsten hexafluoride reacts violently with elemental titanium, such as that of titanium layer 150. As a result, any flaw in the protective titanium nitride layer 150 that allows tungsten hexafluoride to contact the underlying titanium layer 150 may result in a defect. This source of defects is a major concern, particularly when employing sub-half-micron integrated circuit technologies. Moreover, the deposition of titanium layer 150 is expensive and wastes valuable processing time.

For the foregoing reasons, there is a need for a simpler, more reliable process that avoids the unnecessary formation of defects caused by the interaction of tungsten hexafluoride gas with elemental titanium.

SUMMARY

The present invention is directed to a method that satisfies the need for a simpler, more reliable process for forming low-resistance electrical contacts to silicon. The inventive process avoids the defects associated with the interaction of tungsten hexafluoride gas and elemental titanium, and eliminates the costs associated with providing a layer of elemental titanium.

According to one embodiment of the present invention, a low-resistance electrical contact to a silicon body is created by first forming a titanium silicide layer on the silicon body by depositing titanium metal on the body and subjecting the titanium-coated body to a high-temperature annealing process. A layer of dielectric, such as silicon dioxide, is then deposited on the titanium silicide layer, and contact holes are etched through the dielectric layer to uncover a portion of the underlying titanium silicide layer. The uncovered titanium silicide layer is then exposed to a plasma of active free nitrogen, which converts some of the exposed titanium silicide surface to titanium nitride. A second layer of titanium nitride is then deposited over the converted titanium nitride. Finally, the metal-semiconductor contact is completed when a layer of tungsten is deposited over the second layer of titanium nitride to contact the exposed titanium nitride over the titanium silicide layer.

Because the inventive contact does not include a layer of elemental titanium over the titanium silicide layer, the need for a second titanium deposition step, and the defects associated therewith, are eliminated. Therefore, as compared to prior art processes, the present inventive process is faster, less expensive, and results in a more reliable contact.

DESCRIPTION OF THE DRAWINGS

These and other features, aspects, and advantages of the present invention will become understood with regard to the following description, appended claims, and accompanying drawings, where:

DETAILED DESCRIPTION

The inventive structure described with respect to FIGS. 8–11 has numerous structural similarities to the prior art of FIGS. 1–7. For simplicity, similar elements are given common reference numbers.

Figure 1:
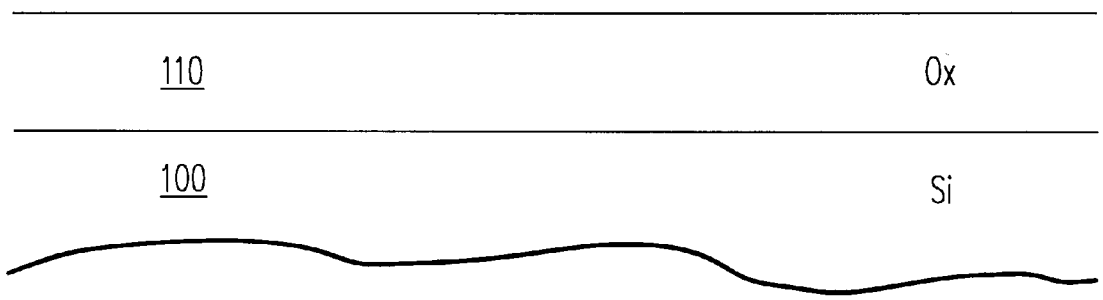
FIG. 1 shows an oxide layer formed over a silicon body.
Figure 2:
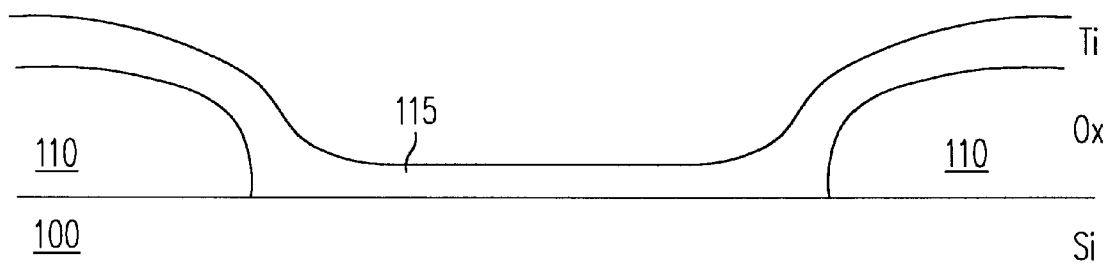
FIG. 2 shows a titanium layer formed over an opening in the oxide layer of FIG. 1.
Figure 3:
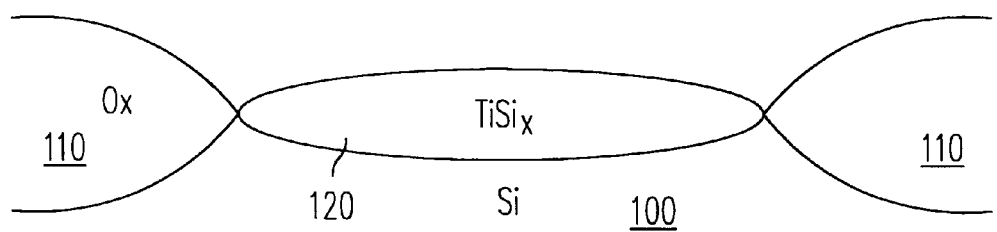
FIG. 3 shows the result of annealing the structure of FIG. 2 and removing unreacted portions of titanium.
Figure 4:
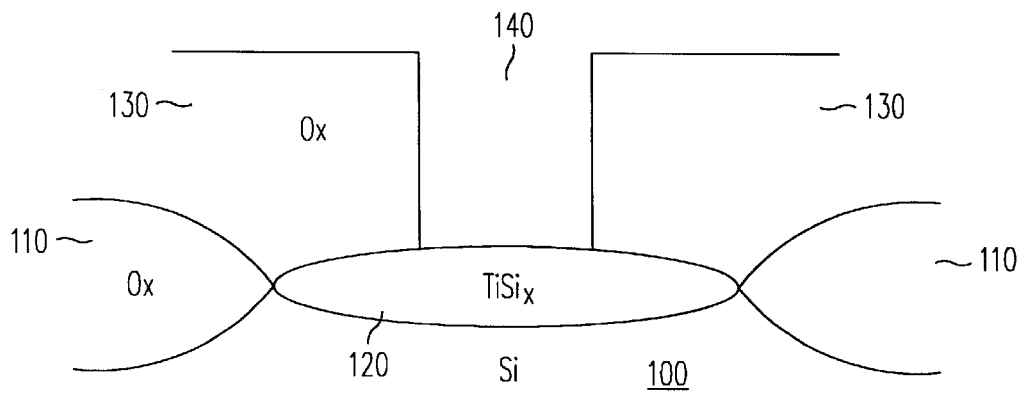
FIG. 4 shows a conventional titanium silicide contact.
Figure 5:
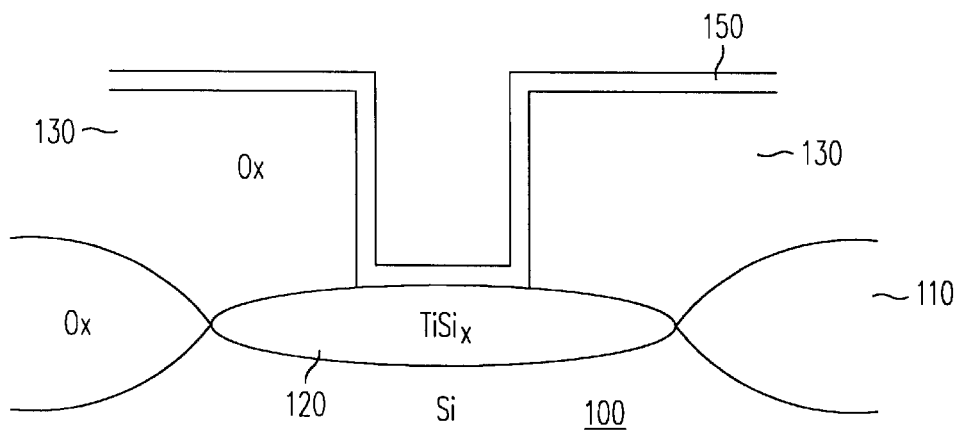
FIG. 5 shows the addition of a titanium layer over the conventional titanium silicide contact of FIG. 4.
Figure 6:
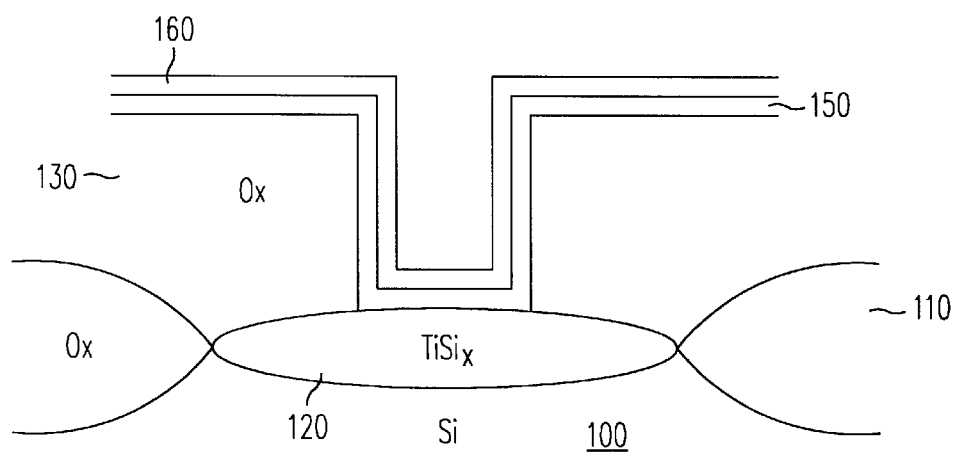
FIG. 6 shows the addition of a titanium nitride layer over the titanium layer described with respect to FIG. 5.
Figure 7:
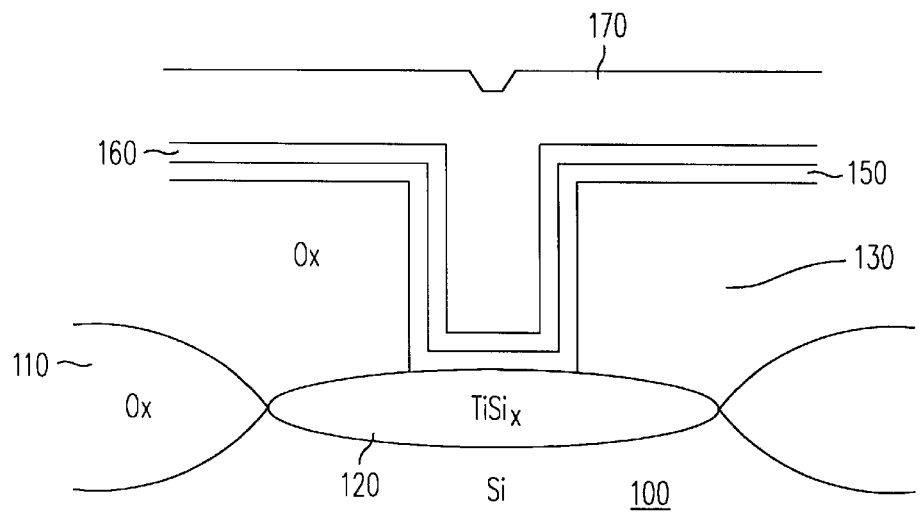
FIG. 7 shows a conventional metal-to-silicon contact.
Figure 8:
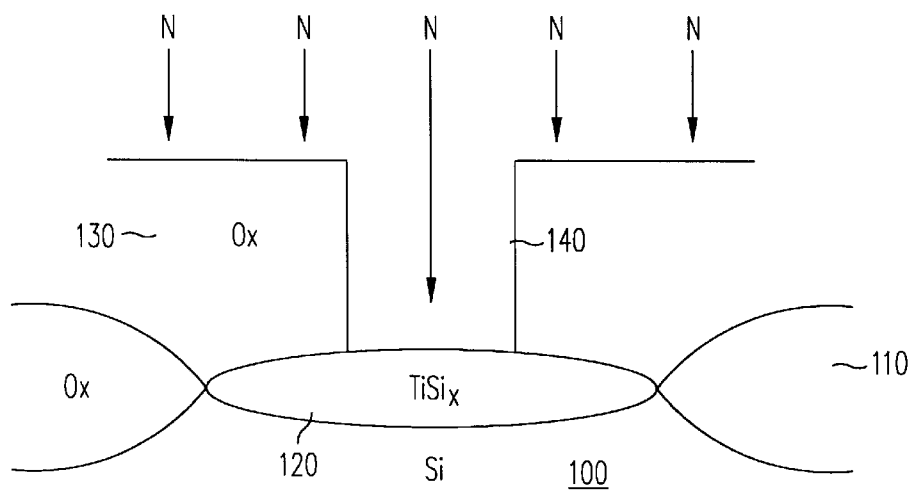
FIG. 8 shows the conventional titanium silicide contact of FIG. 4 being exposed to active free nitrogen in accordance with the present invention.

The structure of FIG. 8 is the same conventional structure as described above in connection with FIG. 4. However, in accordance with the present invention, the structure of FIG. 8 is exposed to active free nitrogen (N), as indicated by the arrows. The active free nitrogen may be produced by generating a plasma above silicon body 100 using a nitrogen source gas, such as $N_2$ or $NH_3$. The nitrogen plasma may be generated using a number of conventional plasma-generating methods, such as those that use DC, RF, or microwave power sources.

Using active free nitrogen, the surface of titanium silicide layer 120 is converted to titanium nitride at relatively low temperatures (e.g., 25–450° C.). This low-temperature conversion offers an advantage over the prior art, which requires high-temperature RTA operations to create a low-resistance interface between the titanium and titanium nitride layers. Such high-temperature processes may cause undesired dopant diffusion in underlying and adjacent structures. In addition, processes involving certain dielectric materials, such as spin-on glasses, must be carried out at relatively low temperatures, and therefore benefit from the advantageous low-temperature conversion offered by the present invention.

Figure 9:
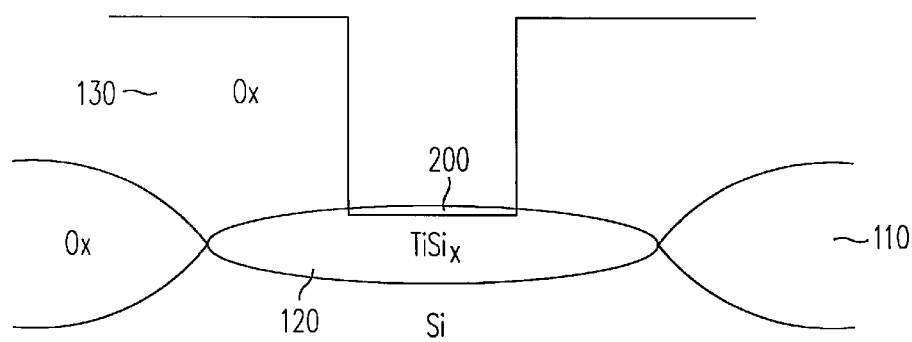
FIG. 9 shows the resulting first layer of titanium nitride when the structure of FIG. 8 is exposed to active free nitrogen.

As shown in FIG. 9, the active free nitrogen N reacts with titanium silicide layer 120 to produce a titanium nitride layer 200, which provides a protective barrier for underlying titanium silicide layer 120. Titanium nitride layer 200 is not pure titanium nitride, but includes some silicides from the interaction with titanium silicide layer 120. In addition, the conversion of a portion of titanium silicide layer 120 to titanium nitride layer 200 removes native, high-resistivity metal oxides (so-called "resident" oxides) from the surface of titanium silicide layer 120, some of which may remain in titanium nitride layer 200. The removal of the resident oxides has the beneficial effect of decreasing the electrical resistance of the contacts formed using the inventive process described herein.

Figure 10:
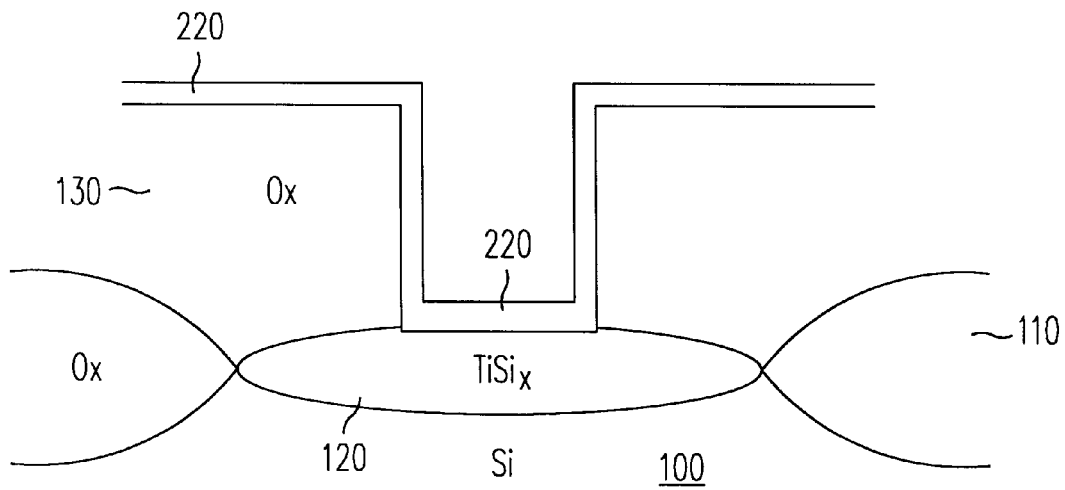
FIG. 10 shows a second titanium nitride layer deposited on the first titanium nitride layer.

Referring to FIG. 10, once titanium nitride layer 200 is grown on titanium silicide layer 120, conventional physical vapor deposition (PVD) or chemical vapor deposition (CVD) titanium nitride deposition processes can be used to deposit titanium nitride directly on titanium nitride layer 200. Deposited titanium nitride combines with titanium nitride layer 200 to form titanium nitride layer 220. For examples of titanium nitride deposition techniques, application Ser. No. 08/347,781, now abandoned incorporated herein by reference.

Figure 11:
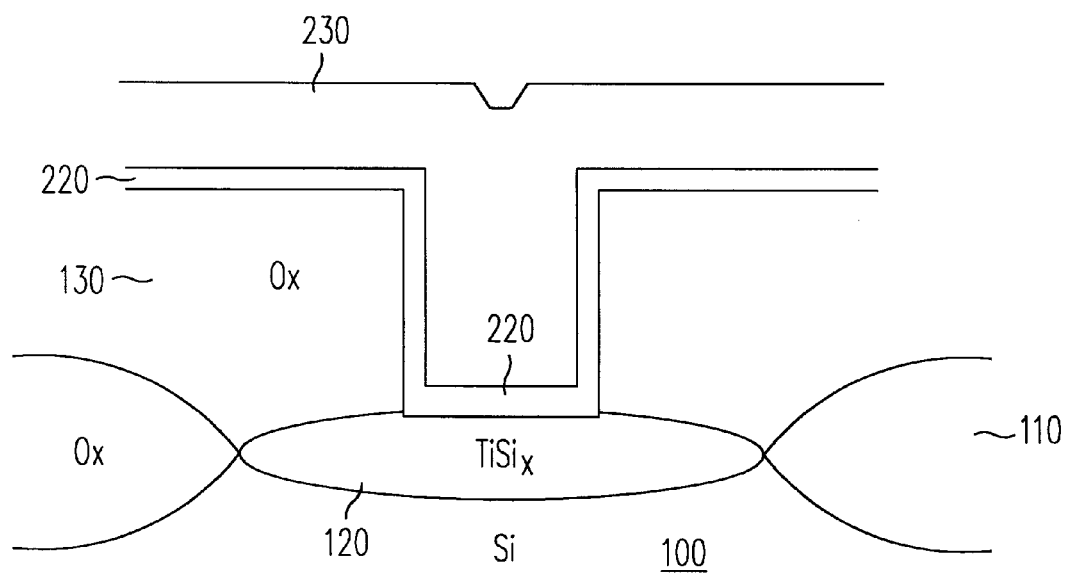
FIG. 11 shows metal-semiconductor contact formed in accordance with the present invention.

Finally, as shown in FIG. 11, a tungsten-plug deposition is used to create tungsten plug 230. The inventive metal-silicon contact of FIG. 11 is structurally different from that of prior-art FIG. 7 in that the inventive contact lacks titanium layer 150. Importantly, the tungsten-plug deposition of FIG. 11 can be carried out using tungsten hexafluoride gas without concern for defect-causing interactions between the tungsten hexafluoride gas and elemental titanium.

Although the present invention has been described in considerable detail with reference to certain preferred versions thereof, other versions are possible. For example, (1) titanium silicide layer 120 may be exposed to active nitrogen species before deposition of dielectric 130, (2) metal silicides other than titanium silicide, such as cobalt silicide or platinum silicide, can similarly be converted to their nitrides, (3) materials other than titanium nitride can be subsequently deposited on the nitrogen-converted titanium silicide surface, and (4) metals other than tungsten, such as aluminum, copper, or gold, may be used to form a plug contact similar to tungsten plug 230 of FIG. 11. Therefore, the spirit and scope of the appended claims should not be limited to the description of the preferred versions contained herein.

I claim:

1. A metal-semiconductor contact comprising:

a semiconductor body;

a dielectric layer formed over said semiconductor body, said dielectric layer having a contact formed therein and including a top surface;

a titanium silicide layer substantially free of resident oxides overlying and in contact with said semiconductor body, said titanium silicide layer including a top surface defined by said contact hole;

a combination layer of titanium nitride combined with titanium silicide, said combination layer formed on said top surface of said titanium silicide layer;

a titanium nitride layer overlying and in contact with said combination layer at said contact hole, said titanium nitride layer overlying and in contact with said dielectric layer at said top surface of said dielectric layer; and a vapor-deposited tungsten layer in contact with said titanium nitride layer.

2. The contact of claim 1, wherein said combination layer is formed by exposing said top surface of said titanium silicide layer to active free nitrogen.

3. The contact of claim 1, wherein said vapor-deposited tungsten layer forms a metal plug overlying and in contact with said titanium nitride layer.

4. The contact of claim 1, wherein said titanium nitride layer is formed using vapor deposition techniques.

5. A metal-semiconductor contact comprising:

a semiconductor body;

a dielectric layer formed over said semiconductor body, said dielectric layer having a contact formed therein and including a top surface;

a titanium silicide layer substantially free of resident oxides overlying and in contact with said semiconductor body, said titanium silicide layer including a top surface that includes titanium nitride formed by exposing said top surface of said titanium silicide layer to active free nitrogen resulting in a combination layer of titanium nitride combined with silicides, said top surface of said titanium silicide layer defined by said contact hole;

a titanium nitride layer overlying and in contact with said combination layer at said contact hole, said titanium nitride layer overlying and in contact with said dielectric layer at said top surface of said dielectric layer; and a vapor-deposited tungsten layer in contact with said titanium nitride layer.

6. The contact of claim 5, wherein said vapor-deposited tungsten layer forms a metal plug overlying and in contact with said titanium nitride layer.

7. The contact of claim 5, wherein said titanium nitride layer is formed by vapor deposition.

8. The contact of claim 5, wherein the active free nitrogen is produced by generating a plasma using a nitrogen source gas.

* * * * *